United States Patent [19]

Wang

[11] Patent Number: 5,741,727
[45] Date of Patent: Apr. 21, 1998

[54] CIRCUIT MODIFICATION AND REPAIR USING A LOW RESISTANCE CONDUCTING METAL BRIDGE AND A FOCUSED ION BEAM

[75] Inventor: Tai-Ho Wang, Hsinchu, Taiwan

[73] Assignee: Industrial Technology Research Institute, Hsin-Chu, Taiwan

[21] Appl. No.: 862,795

[22] Filed: May 23, 1997

[51] Int. Cl.⁶ .................................................. H01L 21/00
[52] U.S. Cl. .................................................. 438/4; 438/619
[58] Field of Search ........................ 438/4, 619, 620

[56] References Cited

U.S. PATENT DOCUMENTS

| | | | |
|---|---|---|---|
| 4,857,481 | 8/1989 | Tam et al. | 438/619 |
| 5,219,713 | 6/1993 | Robinson | 438/619 |
| 5,289,416 | 2/1994 | Iwai et al. | 365/200 |
| 5,429,994 | 7/1995 | Ishikawa | 437/230 |
| 5,480,812 | 1/1996 | Salisbury | 438/4 |
| 5,483,490 | 1/1996 | Iwai et al. | 365/200 |

OTHER PUBLICATIONS

Van Doorselaer et al. "How To Use Cu–Plating for Low–Ohmic Long–Distance FIB Connections", Proceedings of the 20th International Symposium for Testing and Failure Analysis, Nov. 13–18, 1994, pp. 397–405.

Silverman, "Laser Microchemical Technology enables real-time editing of first run Silicon," Solid State Technology, Sep. 1996, pp. 113–119.

*Primary Examiner*—Jey Tsai
*Attorney, Agent, or Firm*—George O. Saile; Stephen B. Ackerman; Larry J. Prescott

[57] ABSTRACT

A fast economical method for modification or repair of micro-circuit wiring patterns covered by a dielectric using a conducting bridge and focused ion beam technology. A conducting bridge is formed on the dielectric between selected points of the wiring pattern using a mask formed by assembling selectively shaped pieces of a transparent mask material such as plastic. The conducting bridge is formed from a material such as gold, copper, or platinum and has sufficient conductivity for long distances. A focused ion beam is then used to form contact holes in the dielectric thereby exposing selected regions of the wiring pattern for connection to the conducting bridge. Connecting material is then selectively deposited using focussed ion beam assisted chemical vapor deposition to connect the conducting bridge to the appropriate points of the wiring pattern. The length of the connecting material does not exceed about 200 micrometers and thus has adequate conductivity. If desired, a focussed ion beam can then be used to form delete holes in the dielectric and remove parts of the wiring pattern.

26 Claims, 8 Drawing Sheets

CIRCUIT MODIFICATION AND REPAIR USING A LOW RESISTANCE CONDUCTING METAL BRIDGE AND A FOCUSED ION BEAM

BACKGROUND OF THE INVENTION

(1) FIELD OF THE INVENTION

The invention relates to the repair and modification of micro-circuit wiring patterns and more particularly to the use of a conducting metal bridge to achieve long metal lines with low resistance. The conducting metal bridge is connected to the wiring pattern using focused ion beam and focused ion beam assisted chemical vapor deposition.

(1) DESCRIPTION OF THE RELATED ART

A paper entitled "How to Use Cu-Plating for Low-Ohmic Long-Distance FIB Connections", by Van Doorselaer et al., Proceedings of the 20th International Symposium for Testing and Failure Analysis, Nov. 13–18, 1994, pages 397–405 describes the use of copper plating in combination with focused ion beam assisted chemical vapor deposition to achieve low resistance for long electrode lines. Long electrode lines formed using focused ion beam assisted chemical vapor deposition have a high resistance. Plating copper on these lines provides a method of lowering the resistance of the long electrode lines.

A paper entitled "Laser microchemical technology enables real-time editing of first-run silicon", by Silverman, Solid State Technology, September 1996, pages 113–119 describes the use of LASER microchemical technology to achieve low resistance for long electrode lines.

U.S. Pat. No. 5,283,490 to Iwai et al. and U.S. Pat. No. 5,483,490 to Iwai et al. describe the modification and repair of micro-circuits using resist directly exposed with an electron beam and circuit modifications accomplished using a focused ion beam.

U.S. Pat. No. 5,429,994 to Ishikawa describes modification and repair of micro-circuits using focused ion beam assisted chemical vapor deposition of electrodes. Electroless plating is then used to deposit additional material on the electrodes to achieve a lower resistance.

This invention describes the use of a low resistance conducting metal bridge to form long electrodes having a low resistance for the modification and repair of micro-circuit wiring patterns. The conducting metal bridge is formed using a patterned transparent mask and sputtering or evaporation of a conductor. The connections from the conducting metal bridge to the wiring pattern are formed using focused ion beam assisted chemical vapor deposition which have a low resistance because the length of these connections is small. The method of this invention is economical, fast, and has very little risk of damage to the circuit under repair.

SUMMARY OF THE INVENTION

Modification and repair of micro circuit wiring patterns requires the cutting of conducting electrodes already formed and the formation of new conducting electrodes, which are connected to the appropriate points in the wiring pattern. A focused ion beam is often used for this type of circuit repair providing means for removing unwanted material and local deposition of new material.

One of the key problems encountered in using a focused ion beam for circuit repair is the relatively low conductivity of locally deposited conducting material. This conductivity provides adequate conductance for short electrodes, less than about 500 micrometers, but is often a problem for longer electrode lengths. Localized plating methods supplementing the focused ion beam methods can provide improved conductivity but the cost of such methods is high. LASER methods can also be used to provide improved conductivity but the cost of these methods is also high.

It is a principle objective of this invention to provide an economical method of forming long localized electrodes having good conductivity.

It is another principle objective of this invention to provide an economical method of modification and repair of micro-circuits using long localized electrodes having good conductivity.

These objectives are achieved using a conducting bridge electrode selectively placed on the circuit being modified or repaired. The conducting bridge electrode is formed of a material such as gold, copper, platinum, or the like, deposited through a mask formed from pieces of transparent mask material. The conducting bridge electrode material is deposited using a scanning electron microscope coating system, evaporation, or sputtering and forms a conductor having adequate conductivity for long electrodes. The preferred methods of electrode material deposition in this invention are the scanning electron microscope (SEM) coating system or evaporation because the equipment is frequently used in the industry so it is usually readily available, providing a more economical method. The ends of the conducting bridge electrodes are then connected to the appropriate points of the circuits being modified or repaired using focused ion beam assisted chemical vapor deposition of connector electrodes. These connector electrodes are less than 500 micrometers long and provide adequate conductance. Focused ion beam methods are also used to open holes in dielectric layers in order to provide access to the circuit being modified or repaired and to delete unwanted regions of conductors.

This invention describes a method which is very economical, fast, has little risk of damage to the circuit under repair or modification, and uses equipment which is readily available. The mask used for the deposition of the conducting bridge is easily fabricated and can be easily located on the circuit under repair or modification using an optical microscope.

DESCRIPTION OF THE PREFERRED EMBODIMENTS

Figure 1:
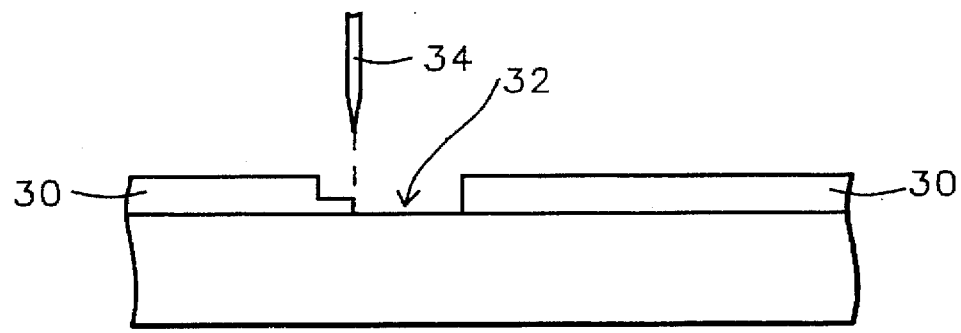
FIG. 1 shows a cross section diagram of a focused ion beam used to remove dielectric material.
Figure 2:
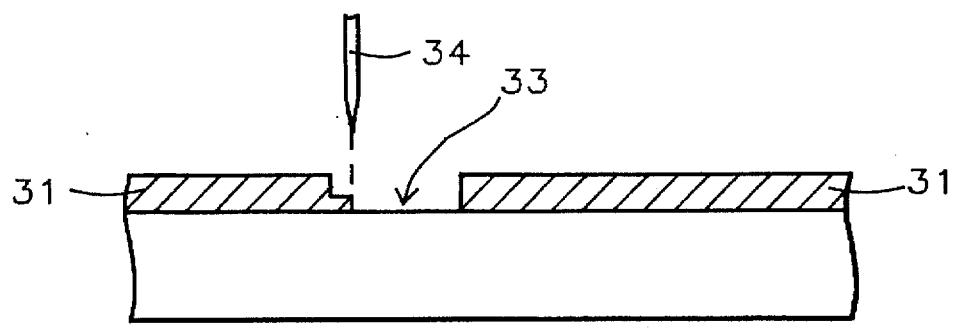
FIG. 2 shows a cross section diagram of a focused ion beam used to remove conducting material.
Figure 3:
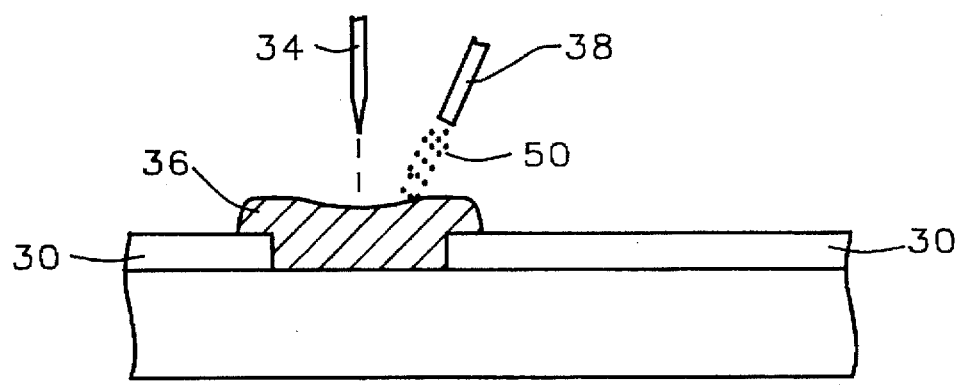
FIG. 3 shows a cross section diagram of focused ion beam assisted chemical vapor deposition of conducting material.

Refer now to FIGS. 1–3 for a description of the use of a focused ion beam to locally remove and deposit material on a micro-circuit substrate. FIG. 1 shows a cross section diagram of a focused ion beam 34, such as beam of gallium ions, used to remove dielectric material thereby forming a hole 32 in the dielectric layer 30. FIG. 2 shows a cross section diagram of a focused ion beam 34, such as a beam of gallium ions, used to remove conductor material thereby forming a break 33 in the conducting electrode 31. FIG. 3 shows a cross section diagram of focused ion beam assisted chemical vapor deposition. As shown in FIG. 3, a gas of metal molecules 50, such as a gas of platinum or tungsten molecules, from a nozzle 38 is directed onto a substrate in the presence of a focused ion beam 34. Under these conditions the metal gas forms a solid metal 36, in this example platinum or tungsten, at the location of the focused ion beam 34.

Figure 4:
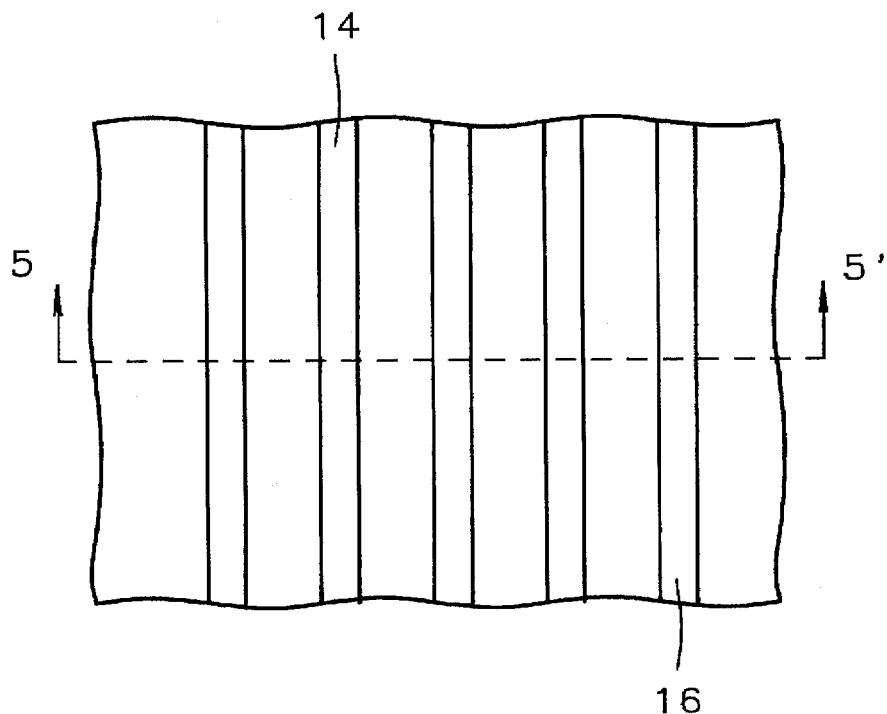
FIG. 4 shows a top view of a wiring pattern formed on a substrate covered by dielectric material.
Figure 5:
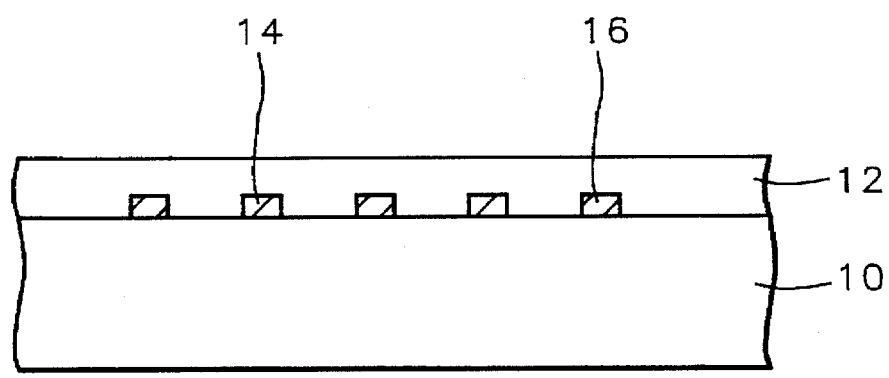
FIG. 5 shows a cross section view of a wiring pattern formed on a substrate covered by dielectric material. The section is taken along line 5–5' of FIG. 4.

Refer now to FIGS. 4–12 for a description of a method of forming the conducting bridge of this invention. FIG. 4 shows a top view of a wiring pattern formed on a substrate. In this example the conducting bridge will be positioned so that connections can be made to a first electrode 14 and to a second electrode 16 of the wiring pattern. FIG. 5 shows a cross section view of the wiring pattern with the section taken along line 5–5' of FIG. 4. FIG. 5 shows the wiring pattern formed on a substrate 10 which can be an integrated circuit element with devices formed therein, a chip carrier, or the like. FIG. 5 shows a layer of dielectric material 12 formed over the wiring pattern as a passivation layer. The first electrode 14 and the second electrode 16 are also shown in FIG. 5.

Figure 6:
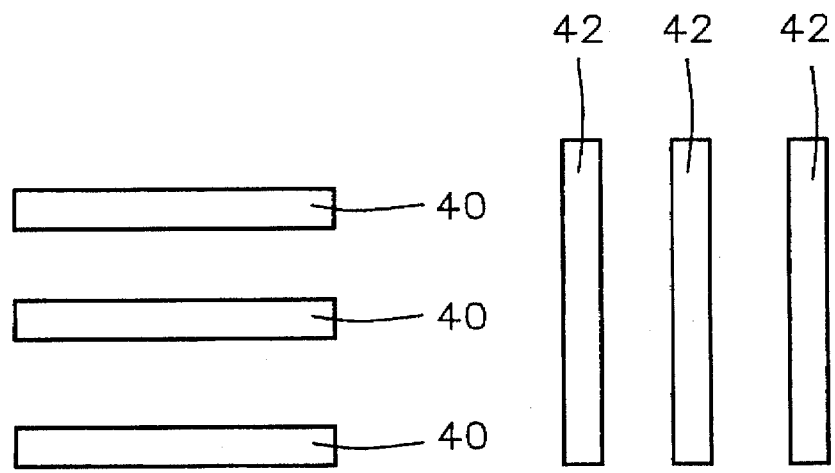
FIG. 6 shows pieces of transparent mask material which will be used to form a mask pattern.
Figure 7:
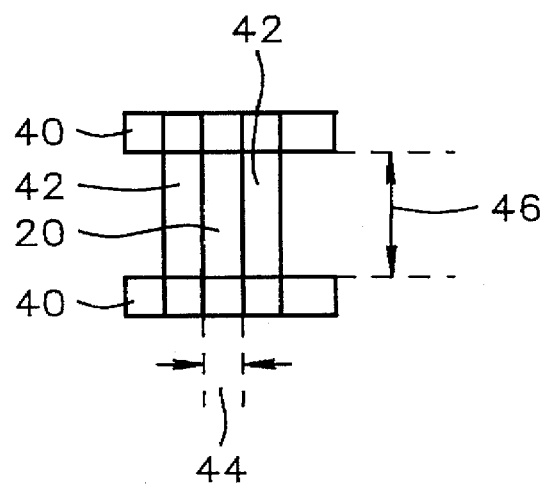
FIG. 7 shows pieces of transparent mask material assembled to form a mask pattern used to form a conducting bridge.

Next transparent mask material is prepared to form a mask which will be used to form the conducting bridge. The transparent mask material, in this example plastic, is cut into strips of appropriate sizes. FIG. 6 shows strips of two different sizes, 40 and 42, to form a mask for use in forming the conducting bridge. The strips, 40 and 42, are then assembled, as shown in FIG. 7, to form an opening 20 having a width 44 and a length 46 and held in place using a material such as 3M ™ plastic tape or the like. The opening 20 has a width 44 of between about 20 and 200 micrometers. The length of the opening 46 will be dependent on the needs of each situation but will usually be 1000 micrometers or longer, however shorter lengths can be used if appropriate. The mask in this example is assembled by hand using optical aids, such as a microscope, if required.

Figure 8:
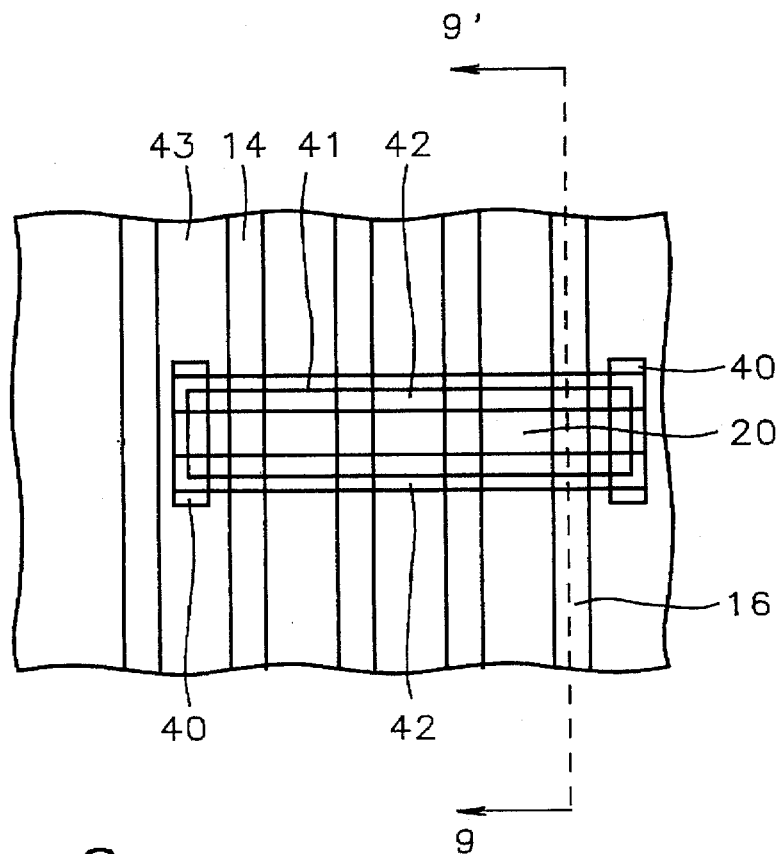
FIG. 8 shows a top view of a wiring pattern formed on a substrate covered by dielectric material with a mask pattern used to form a conducting bridge in place.
Figure 9:
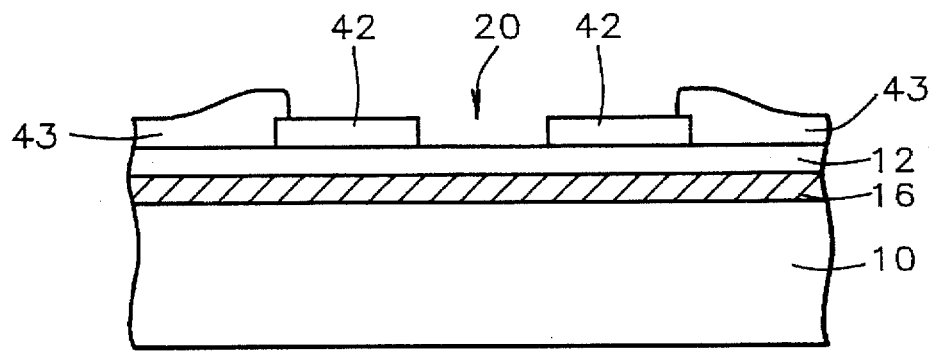
FIG. 9 shows a cross section view of a wiring pattern formed on a substrate covered by dielectric material with a mask pattern used to form a conducting bridge in place. The section is taken along line 9–9' of FIG. 8.

Next, as shown in FIG. 8, the mask formed from the transparent mask material is placed over the wiring pattern using optical microscope aids so that the ends of the pattern 20 in the transparent mask material are near the regions where the conducting bridge will be connected to the first electrode 14 and the second electrode 16. In order to protect the remainder of the wiring pattern and substrate from the next few processing steps protective material 22, such as 3M ™ plastic tape, is placed over the remainder of the wiring pattern, substrate, bonding pads, and IC pins. FIG. 9 shows a cross section view of the mask formed from transparent mask material 42 placed over the dielectric material 12, the wiring pattern including the first electrode 14 and the second electrode 16, and the protective material 43, in this example 3M ™ plastic tape. FIG. 9 is a section view of FIG. 8 taken along line 9–9' f FIG. 8.

Figure 10:
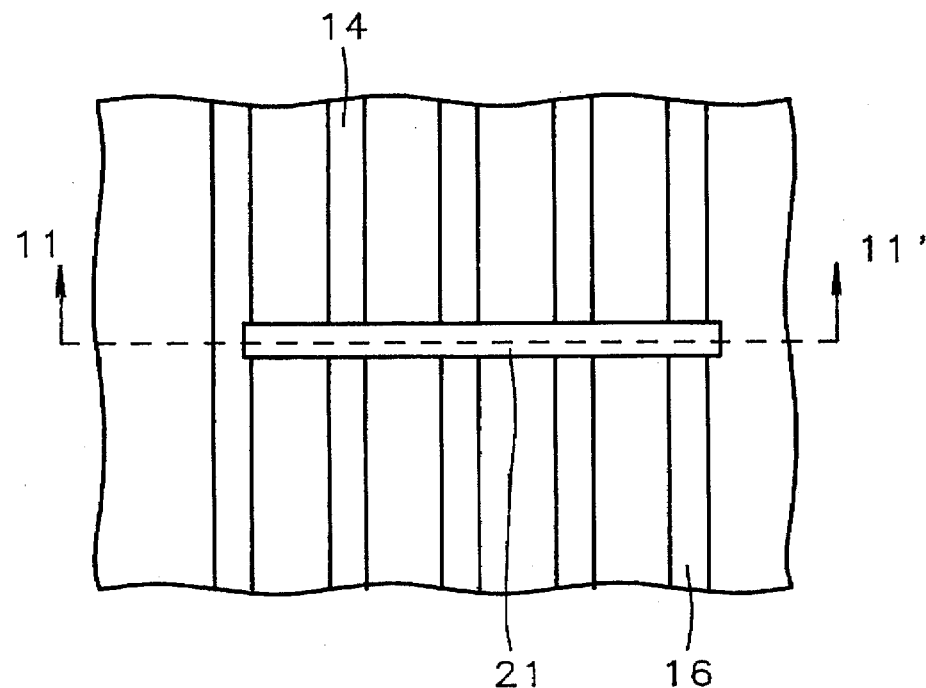
FIG. 10 shows a top view of a wiring pattern formed on a substrate covered by dielectric material and a conducting bridge formed on the dielectric material.

Next conductive material, such as gold, copper, platinum, or the like is formed on the patterned transparent mask filling the pattern 20 with conductive material. In this example the conductive material is formed using an SEM (scanning electron microscope) coating system, however evaporation or sputtering can also be used. The SEM coating system has the advantage of being readily available. The mask and the protective material, such as the 3M ™ plastic tape, are then removed leaving a conducting bridge 21, as is shown in FIG. 10. The conducting bridge formed in this manner has a thickness of between about 8,000 and 12,000 Angstroms. Resistances of less than two ohms for a conducting bridge having a length of 2000 micrometers can readily be achieved. Conducting bridges with lengths greater than 2000 micrometers can also be formed and a conducting bridge having a length of 10,000 micrometers and a resistance less than 10 ohms can be readily achieved.

Figure 11:
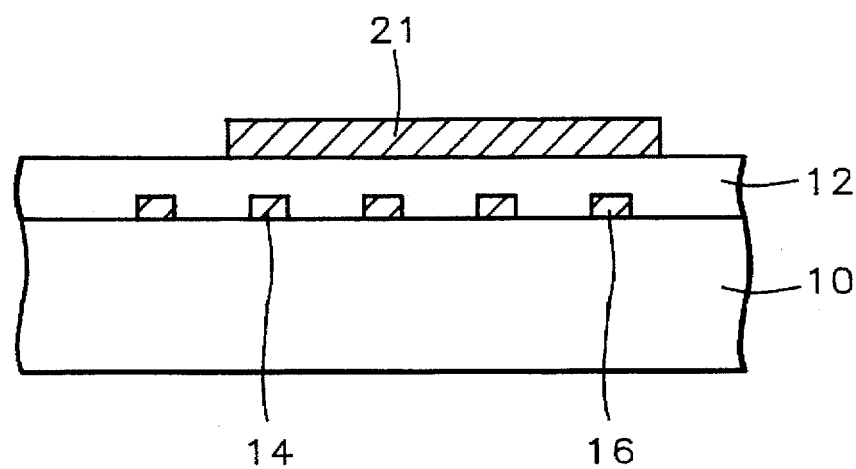
FIG. 11 shows a cross section view of a wiring pattern formed on a substrate covered by dielectric material and a conducting bridge formed on the dielectric material. The section is taken along line 11–11' of FIG. 10.

FIG. 11 shows a cross section of the wiring pattern along line 11–11' of FIG. 10. As shown in FIG. 11 the conducting bridge 21 is formed on the dielectric material 12 covering the wiring pattern. This dielectric material can be a layer of dielectric or simply a coating on the electrodes. The conducting bridge 21 is formed so that a first end of the conducting bridge is near a region of the first electrode 14 to which a connection is to be made and a second end of the conducting bridge is near a region of the second electrode 16 to which a connection is to be made. The registration requirements on the placement of the conducting bridge permits the use of an optical microscope to locate the conducting bridge and the connecting links to the first electrode and the second electrode are kept sufficiently short so that the resistance of these links will be low.

Figure 12:
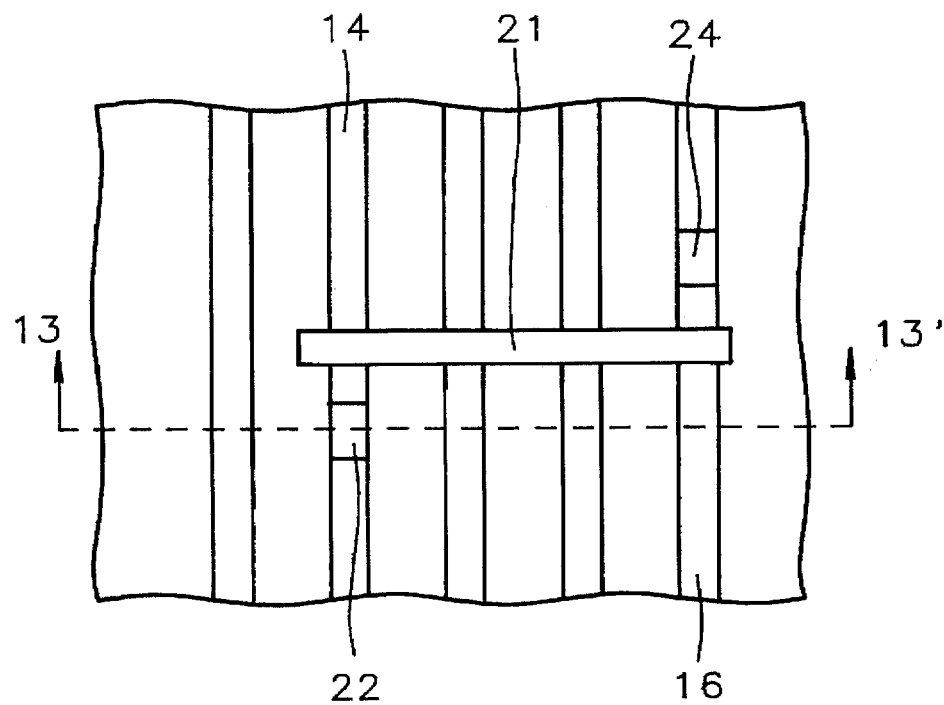
FIG. 12 shows a top view of a wiring pattern formed on a substrate covered by dielectric material, a conducting bridge formed on the dielectric material, and holes formed in the dielectric material.
Figure 13:
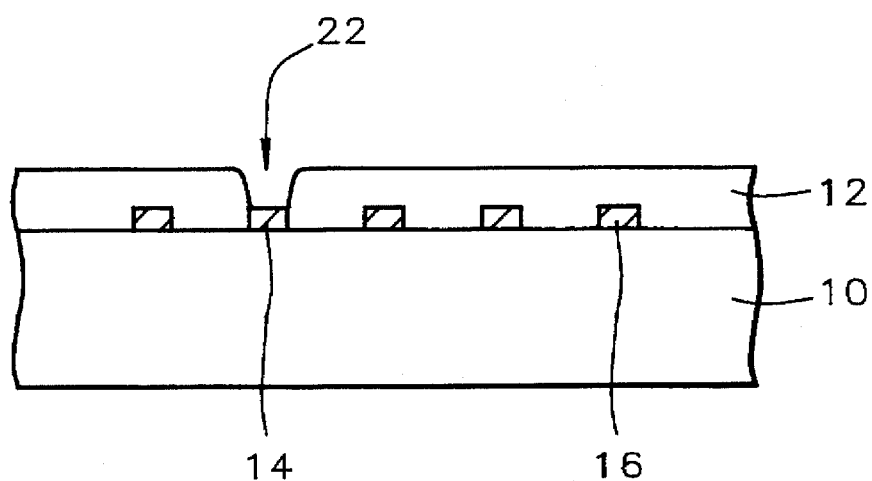
FIG. 13 shows a cross section view of a wiring pattern formed on a substrate covered by dielectric material, a conducting bridge formed on the dielectric material, and holes formed in the dielectric material. The section is taken along line 13–13' of FIG. 12.

Next, as shown in FIG. 12, holes in the dielectric material are formed to allow access to the electrodes of the wiring pattern. A first contact hole 22 will allow the connection between the conducting bridge and the first electrode 14 to be made. A second contact hole 24 will allow the connection between the conducting bridge and the second electrode 24 to be made. In this example the holes are formed using a focused ion beam of gallium ions, as previously described and shown in FIG. 1. FIG. 13 shows a cross section view of the conducting bridge and wiring pattern of FIG. 12 along the line 13–13' of FIG. 12. showing the first contact hole 22 to allow the connection to the first electrode 14.

Figure 14:
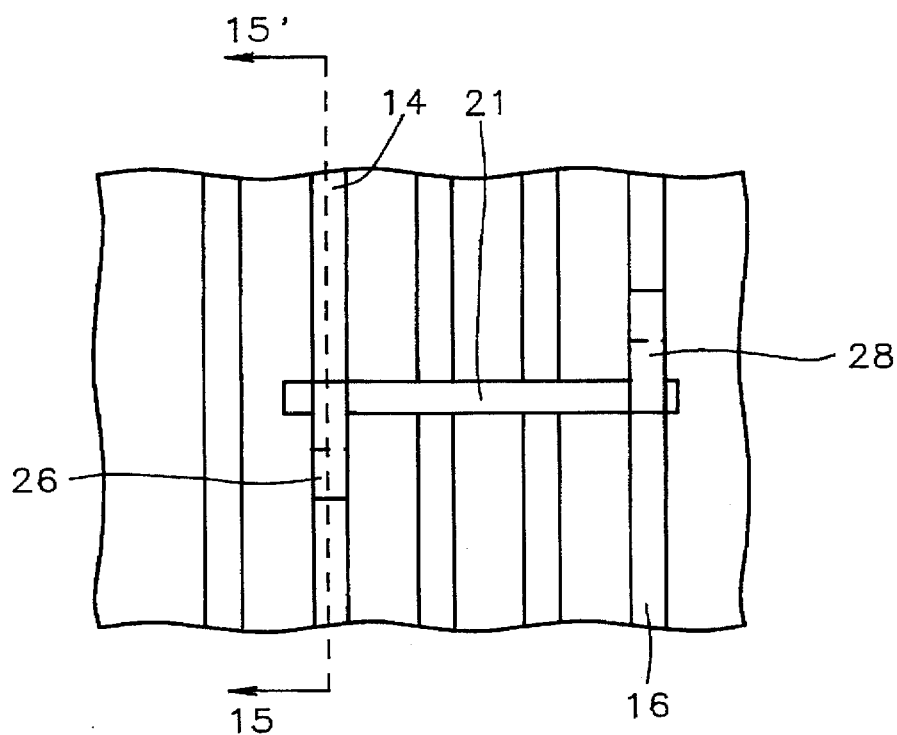
FIG. 14 shows a top view of a wiring pattern formed on a substrate covered by dielectric material, a conducting bridge formed on the dielectric material, holes formed in the dielectric material, and connections between the conducting bridge and the wiring pattern.

Next, as shown in FIG. 14, contact material for a first connection 26, between the first electrode 14 and the conducting bridge 21, and contact material for a second connection 28, between the second electrode 16 and the conducting bridge 21, is formed. The contact material for the first and second connections are formed using focused ion beam assisted chemical vapor deposition. As shown in FIG. 3, a focused ion beam, in this example gallium ions, is directed to the region where conducting material to form the connection is to be formed. A nozzle 38 directs a flow of platinum or tungsten gas to the region of the focused ion beam and platinum or tungsten is deposited in this region. As previously described, contact material deposited in this manner has a relatively low conductivity but these connections are kept very short, less than 200 micrometers. In this way the contact resistance to each of the first and second electrodes can be kept below about 10 ohms.

Figure 15:
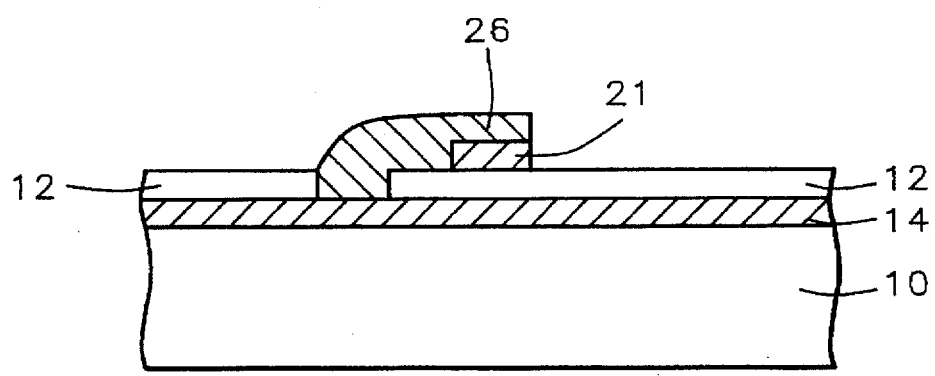
FIG. 15 shows the first electrode covered by dielectric material, the first contact hole in the dielectric material, the conducting bridge, and the connection between the first electrode and the conducting bridge. The section is taken along line 15–15' of FIG. 14.

FIG. 15 shows a cross section view of the connection between the wiring pattern and the conducting bridge taken along line 15–15' of FIG. 14. FIG. 15 shows the platinum or tungsten connection 26 between the first electrode 14 and the conducting bridge 21.

Figure 16:
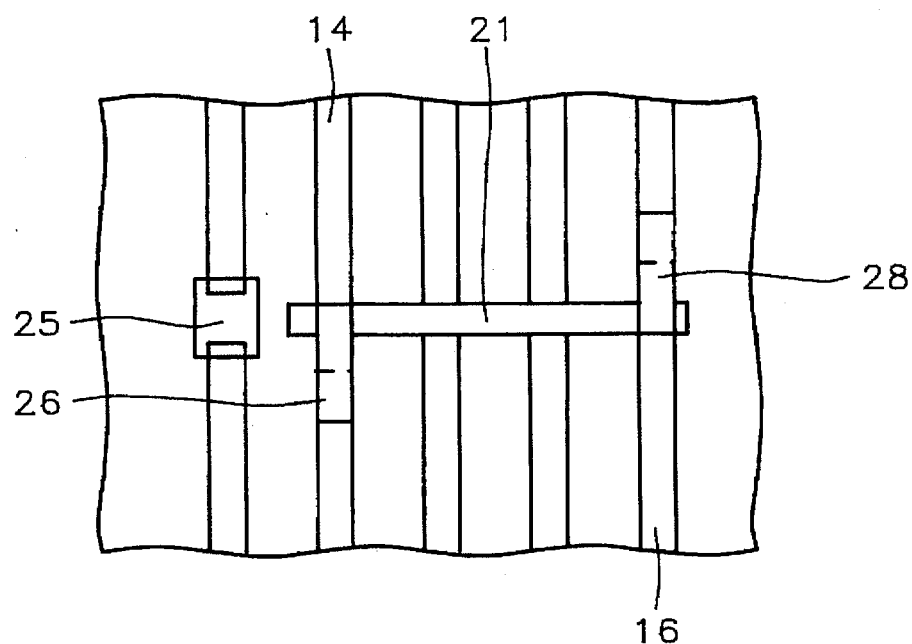
FIG. 16 shows a top view of a wiring pattern formed on a substrate covered by dielectric material with the conducting bridge in place and completed showing a hole formed in the dielectric material with electrode material deleted.

In some cases it may also be necessary or desirable to delete electrode material from one or more electrodes to break the electrical continuity of the electrode. FIG. 16 shows a delete hole formed in the dielectric and electrode material deleted from the electrode exposed when the delete hole 25 is opened. The dielectric and electrode material are removed using a focused ion beam, in this example gallium ions, as previously described and shown in FIGS. 1 and 2. If the formation of a delete hole and deletion of electrode material is required it is done only after the conducting bridge and contacts between the conducting bridge and electrodes have been formed to avoid unwanted electrical shorts from forming.

In the modification or repair of a wiring pattern on a substrate the wiring pattern is tested and the proper deletions and connections determined. The conducting bridge is then formed at the selected location using the transparent mask pattern and an SEM coating system, evaporation, or sputtering. Contact holes are then formed in the dielectric as required using a focused ion beam. Contact material is then formed using focused ion beam assisted chemical vapor deposition. Finally, if required, dielectric material and electrode material is removed at selected locations using a focussed ion beam.

While the invention has been particularly shown and described with reference to the preferred embodiments thereof, it will be understood by those skilled in the art that various changes in form and details may be made without departing from the spirit and scope of the invention.

What is claimed is:

1. A method of forming a bridge, comprising the steps of:
    providing a wiring pattern formed on a substrate having a dielectric material covering said wiring pattern;
    providing selectively shaped pieces of transparent mask material;
    assembling said selectively shaped pieces of transparent mask material to form a bridge mask having a bridge opening;
    selectively placing said bridge mask over said dielectric material covering said wiring pattern;
    filling said bridge opening with conducting bridge material thereby forming a conducting bridge having a first end and a second end;
    removing said bridge mask leaving said conducting bridge having a first end and a second end on said dielectric material;
    forming a first hole in said dielectric material thereby exposing a first contact region of said wiring pattern;
    forming a second hole in said dielectric material thereby exposing a second contact region of said wiring pattern;
    connecting said first contact region of said wiring pattern to said first end of said conducting bridge; and
    connecting said second contact region of said wiring pattern to said second end of said conducting bridge.

2. The method of claim 1 wherein said selectively placing said bridge mask uses an optical microscope.

3. The method of claim 1 wherein said first hole in said dielectric material and said second hole in said dielectric material are formed using a focused ion beam.

4. The method of claim 3 wherein said focused ion beam comprises gallium ions.

5. The method of claim 1 wherein said connecting said first contact region of said wiring pattern to said first end of said conducting bridge and said connecting said second contact region of said wiring pattern to said second end of said conducting bridge are accomplished using focused ion beam assisted chemical vapor deposition.

6. The method of claim 5 wherein said focused ion beam assisted chemical vapor deposition comprises gallium ions and platinum or tungsten gas.

7. The method of claim 1 wherein said filling said bridge opening with conducting bridge material uses a scanning electron microscope coating system, evaporation, or sputtering.

8. The method of claim 1 wherein said conducting bridge is gold having a thickness of between about 8000 and 12000 Angstroms.

9. The method of claim 1 wherein said conducting bridge is copper having a thickness of between about 8000 and 12000 Angstroms.

10. The method of claim 1 wherein said conducting bridge is platinum having a thickness of between about 8000 and 12000 Angstroms.

11. The method of claim 1 wherein said conducting bridge is a rectangle having a width of between about 20 and 200 micrometers.

12. The method of claim 1 further comprising placing protective material over those parts of said substrate not covered by said bridge mask or said bridge mask opening.

13. A method of circuit modification, comprising the steps of:
    providing a wiring pattern formed on a substrate having a dielectric material covering said wiring pattern;
    providing selectively shaped pieces of transparent mask material;
    assembling said selectively shaped pieces of transparent mask material to form a bridge mask having a bridge opening;
    selectively placing said bridge mask over said dielectric material covering said wiring pattern;
    filling said bridge opening with conducting bridge material thereby forming a conducting bridge having a first end and a second end;

removing said bridge mask leaving said conducting bridge having a first end and a second end on said dielectric material;

forming a first hole in said dielectric material thereby exposing a first contact region of said wiring pattern;

forming a second hole in said dielectric material thereby exposing a second contact region of said wiring pattern;

connecting said first contact region of said wiring pattern to said first end of said conducting bridge;

connecting said second contact region of said wiring pattern to said second end of said conducting bridge;

forming a number of delete holes in said dielectric material after connecting said first contact region to said first end of said conducting bridge and connecting said second contact region to said second end of said conducting bridge; and removing part of said wiring pattern in each of said delete holes.

14. The method of claim 13 wherein said selectively placing said bridge mask uses an optical microscope.

15. The method of claim 13 wherein said first contact hole in said dielectric layer and said second contact hole in said dielectric layer are formed using a focused ion beam.

16. The method of claim 13 wherein said delete holes in said forming a number of said delete holes in said dielectric layer and said removing part of said wiring pattern in each of said delete holes uses a focused ion beam.

17. The method of claim 15 wherein said focused ion beam comprises gallium ions.

18. The method of claim 16 wherein said focused ion beam comprises gallium ions.

19. The method of claim 13 wherein said connecting said first contact region of said wiring pattern to said first end of said conducting bridge and said connecting said second contact region of said wiring pattern to said second end of said conducting bridge are accomplished using focused ion beam assisted chemical vapor deposition.

20. The method of claim 19 wherein said focused ion beam assisted chemical vapor deposition comprises gallium ions and platinum or tungsten gas.

21. The method of claim 13 wherein said conducting bridge is formed using a scanning electron microscope coating system, evaporation, or sputtering.

22. The method of claim 13 wherein said conducting bridge is gold having a thickness of between about 8000 and 12000 Angstroms.

23. The method of claim 13 wherein said conducting bridge is copper having a thickness of between about 8000 and 12000 Angstroms.

24. The method of claim 13 wherein said conducting bridge is platinum having a thickness of between about 8000 and 12000 Angstroms.

25. The method of claim 13 wherein said conducting bridge has a width of between about 20 and 200 micrometers.

26. The method of claim 13 further comprising placing protective material over those parts of said substrate not covered by said patterned transparent mask or said bridge opening before forming said layer of conducting bridge material and removing said protective material after forming said layer of conducting bridge material.

\* \* \* \* \*